US010325779B2

(12) United States Patent
Rotondaro et al.

(10) Patent No.: US 10,325,779 B2
(45) Date of Patent: Jun. 18, 2019

(54) COLLOIDAL SILICA GROWTH INHIBITOR AND ASSOCIATED METHOD AND SYSTEM

(71) Applicant: Tokyo Electron Limited, Minato-ku, Tokyo (JP)

(72) Inventors: Antonio L.P. Rotondaro, Austin, TX (US); Wallace P. Printz, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/467,939

(22) Filed: Mar. 23, 2017

(65) Prior Publication Data

US 2017/0287725 A1    Oct. 5, 2017

Related U.S. Application Data

(60) Provisional application No. 62/315,559, filed on Mar. 30, 2016, provisional application No. 62/315,632, filed on Mar. 30, 2016.

(51) Int. Cl.
*H01L 21/67*     (2006.01)
*H01L 21/311*    (2006.01)
(Continued)

(52) U.S. Cl.
CPC ........ *H01L 21/31111* (2013.01); *C09K 13/04* (2013.01); *C09K 13/06* (2013.01);
(Continued)

(58) Field of Classification Search
CPC ...... C09K 13/04; C09K 13/06; C09K 3/1409; C09K 3/1463; H01L 21/31111; H01L 21/6708; H01L 21/67253; H01L 21/67075
(Continued)

(56) References Cited

U.S. PATENT DOCUMENTS

| 4,116,714 A | 9/1978 | Basi |
| 5,885,903 A | 3/1999 | Torek et al. |

(Continued)

FOREIGN PATENT DOCUMENTS

| JP | H06-349808 A | 12/1994 |
| JP | 2014099480 A | 5/2014 |

(Continued)

OTHER PUBLICATIONS

Mavredaki et al., "Inhibition and Dissolution as Dual Mitigation Approaches for Colloidal Silica Fouling and Deposition in Process Water Systems: Functional Synergies", Ind. Eng. Chem. Res., 2005, 8 pgs.

(Continued)

*Primary Examiner* — Lan Vinh
(74) *Attorney, Agent, or Firm* — Wood Herron & Evans LLP

(57) ABSTRACT

A technique to inhibit the growth of colloidal silica deposits on surfaces treated in phosphoric acid is described. In one embodiment, the disclosed techniques include the use of a colloidal silica growth inhibitor as an additive to a phosphoric acid solution utilized for a silicon nitride etch. In some embodiments, the additive may have chemistry that may contain strong anionic groups. A method and apparatus is provided that monitors the silica concentration and/or the colloidal silica growth inhibitor concentration in the phosphoric acid solution during processing and adjusts the amount of those components as needed. Techniques are provided for a method and apparatus to control the additive concentration to be used as well as the silica concentration in the phosphoric acid solution. The techniques described herein provide a high selectivity etch of silicon nitride towards silicon dioxide without the growth of colloidal silica deposits on the exposed surfaces.

19 Claims, 7 Drawing Sheets

(51) Int. Cl.
*C09K 13/04* (2006.01)
*C09K 13/06* (2006.01)

(52) U.S. Cl.
CPC .... *H01L 21/6708* (2013.01); *H01L 21/67253* (2013.01); *H01L 21/67075* (2013.01)

(58) Field of Classification Search
USPC .......... 156/345.11, 345.21, 345.22; 438/692, 438/693, 691, 694, 750, 754, 756, 757; 216/89, 99
See application file for complete search history.

(56) References Cited

U.S. PATENT DOCUMENTS

| | | | |
|---|---|---|---|
| 6,391,213 B1* | 5/2002 | Homola | B82Y 10/00 204/192.15 |
| 7,367,870 B2* | 5/2008 | Kurata | B24B 37/0056 257/E21.304 |
| 7,635,397 B2 | 12/2009 | Okuchi | |
| 8,685,272 B2* | 4/2014 | Kim | H01L 21/31111 252/79.1 |
| 8,727,002 B2 | 5/2014 | Reyes | |
| 2008/0064223 A1 | 3/2008 | Eguchi et al. | |
| 2008/0170931 A1* | 7/2008 | Hashimoto | H01L 21/67742 414/225.01 |
| 2010/0035436 A1 | 2/2010 | Kim et al. | |
| 2011/0259376 A1* | 10/2011 | Wagener | H01L 21/67051 134/94.1 |
| 2012/0058629 A1 | 3/2012 | You et al. | |
| 2012/0161068 A1 | 6/2012 | Greene et al. | |
| 2012/0247505 A1 | 10/2012 | Brown et al. | |
| 2012/0289056 A1 | 11/2012 | Bergman et al. | |
| 2012/0322263 A1* | 12/2012 | Lee | B81C 1/00626 438/689 |
| 2013/0005219 A1* | 1/2013 | Takemura | B24B 13/015 451/36 |
| 2014/0080310 A1 | 3/2014 | Chen et al. | |
| 2014/0273373 A1 | 9/2014 | Makala et al. | |
| 2014/0374023 A1* | 12/2014 | Kosub | H01L 21/02052 156/345.23 |
| 2015/0024989 A1 | 1/2015 | Chhabra et al. | |
| 2015/0371869 A1 | 12/2015 | Surla et al. | |
| 2015/0380423 A1 | 12/2015 | Kanakamedala et al. | |
| 2016/0108284 A1* | 4/2016 | Yoshizaki | C09K 3/1463 252/79.1 |

FOREIGN PATENT DOCUMENTS

| | | |
|---|---|---|
| TW | 576865 B | 2/2004 |
| TW | 201009051 A | 3/2010 |
| TW | 201246354 A | 11/2012 |
| TW | 201541510 A | 11/2015 |
| WO | 2010005889 A1 | 1/2010 |
| WO | 2010135039 A1 | 11/2010 |
| WO | 2012059714 | 5/2012 |
| WO | 2013148911 A1 | 10/2013 |

OTHER PUBLICATIONS

Microtech Systems, Inc., "Phosphoric Acid Nitride Removal", 2007, 9 pgs.
International Searching Authority, International Search Report and Written Opinion issued in counterpart International Application No. PCT/US2017/024123 dated Jul. 4, 2017, 16 pp.
International Searching Authority, International Search Report and Written Opinion issued in related International Application No. PCT/US2017/024128 dated Jul. 4, 2017, 9 pp.
Seo, Dongwan et al., Selective Wet Etching of Si3N4/SiO2 in Phosphoric Acid with the Addition of Fluoride and Silicic Compounds, Microelectronic Engineering, 2014, vol. 118, pp. 66-71.
Taiwan Intellectual Property Office, Notice of Examination Opinions issued in counterpart TW Patent Application No. 106110443 dated May 16, 2018, 19 pp, including English translation.
U.S. Patent and Trademark Office, Non-final Office Action issued in related U.S. Appl. No. 15/467,973 dated May 17, 2018, 22 pp.
Machine Translation of JP Patent Publication H06-349808, 15 pp.
Taiwan Intellectual Property Office, First Office Action issued in related Taiwan Application No. 106110416 dated Jan. 15, 2018, 19 pp.
Taiwan Intellectual Property Office, Notification of Examination Opinions issued in related TW Patent Application No. 106110416 dated Oct. 1, 2018, 9 pgs., including partial English translation.
Chang Chien, Ying-Hsueh et al., "A Design Selective Wet Etching of Si3N4/SiO2 in Phosphoric Acid Using a Single Wafer Processor", Journal of the Electrochemical Society, 2018, vol. 165 (4), pp. H3187-H3191.
U.S. Patent and Trademark Office, Final Office Action issued in corresponding U.S. Appl. No. 15/467,973 dated Nov. 29, 2018, 28 pages.

* cited by examiner

COLLOIDAL SILICA GROWTH INHIBITOR AND ASSOCIATED METHOD AND SYSTEM

This application claims priority to Provisional Patent Application No. 62/315,632, filed Mar. 30, 2016; the disclosure of which is expressly incorporated herein, in its entirety, by reference. This application also incorporates by reference, in its entirety, concurrently filed U.S. patent application Ser. No. 15/467,973, entitled "Process and Apparatus for Processing a Nitride Structure Without Silica Deposition," by Bassett et al., which claims priority to Provisional Patent Application No. 62/315,559, filed Mar. 30, 2016.

BACKGROUND

The present disclosure relates to the processing of silicon substrates in phosphoric acid (H3PO4) solutions. In particular, it provides a novel method to prevent the growth of colloidal silica deposits on the substrate surface during processing in phosphoric acid.

Phosphoric acid has been used in the semiconductor industry to remove silicon nitride films with high selectivity to silicon dioxide and pure silicon. In 1967, Gelder and Hauser published an article where they proposed the use of boiling phosphoric acid to remove silicon nitride films. They used the boiling point of the acid at a given dilution to control the acid temperature and its concentration in the process tank. This process has been widely adopted in the semiconductor industry and it is used in production today.

A typical application of the boiling phosphoric acid process in the semiconductor industry is the removal of silicon nitride films. In such applications, the silicon nitride film typically sits on a silicon dioxide film and it is surrounded by deposited silicon dioxide. The process for the removal of the silicon nitride film begins by a careful removal of any remaining silicon dioxide that might rests on top of the silicon nitride film by a diluted hydrofluoric acid (HF) treatment. The dilution of the HF is tailored to remove any remaining silicon dioxide from the surface of the silicon nitride without significantly removing the deposited silicon dioxide that was placed between the silicon nitride regions. After the silicon nitride deglaze step in HF, a high selectivity etch is performed in boiling phosphoric acid to remove the silicon nitride film without removing the deposited silicon dioxide film that exists between the silicon nitride films, stopping on the silicon dioxide film that lays under the silicon nitride film.

It has been found that during processing of certain semiconductor structures the adverse growth of colloidal silica deposits on the exposed silicon dioxide regions may hinder silicon nitride removal and/or other subsequent process steps. There is a need for a method to inhibit the growth of colloidal silica deposition during the treatment of surfaces in phosphoric acid.

SUMMARY

Described herein are innovative methods to inhibit the growth of colloidal silica deposits on surfaces treated in phosphoric acid (H3PO4). In one embodiment, the disclosed techniques include the use of a colloidal silica growth inhibitor as an additive to the phosphoric acid solution. In some embodiments, the additive may have a chemistry that may contain strong anionic groups. Possible anionic groups include, but are not limited to, —COOH and —PO3H2. These chemical groups react with the Si centers in the colloidal silica network leading to the formation of silicate esters R—C(O)—SiOx resulting in the colloidal silica remaining in solution. Other colloidal silica growth inhibitors may also be utilized. In some embodiments, a method and apparatus is provided that monitors the silica concentration and/or the growth inhibitor concentration in the phosphoric acid during processing and adjusts the amount of those components as needed. The techniques described herein provide a high selectivity etch of silicon nitride towards silicon dioxide without the growth of colloidal silica deposits on the exposed surfaces.

In one embodiment, the disclosed techniques include providing a chemical composition for wet etching of structures on a microelectronic substrate. The composition may comprise water, phosphoric acid, and a colloidal silica growth inhibitor, wherein the microelectronic substrate includes at least a first structure and a second structure, the chemical composition etching the first structure selectively to the second structure without creating a growth of colloidal silica deposits on exposed surfaces of the first or second structures.

In another embodiment, a method for wet etching of structures on a microelectronic substrate is provided. The method may comprise loading a substrate into a wet chemical processing system, the substrate having a first structure and a second structure, and dispensing onto the substrate a wet etching solution. The wet etching solution may comprise water, phosphoric acid, and a colloidal silica growth inhibitor, wherein the wet chemical processing system is configured to etch the first structure on the substrate selectively over the second structure on the substrate without creating a growth of colloidal silica deposits on exposed surfaces of the first structure or second structure on the substrate.

In yet another embodiment, a wet chemical processing system is provided. The wet chemical processing system may comprising a chamber configured to receive a substrate and expose the substrate to a wet etch chemical composition. The wet chemical processing system may further comprise a chemical supply system coupled to the chamber, the chemical supply system supplying the wet etch chemical composition to the chamber. The wet etch chemical composition comprises water phosphoric acid, and a colloidal silica growth inhibitor. The wet chemical processing system further comprises a controller configured to control components of the wet chemical processing system, including at least the chemical supply system.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

It has been found that during phosphoric acid etching of silicon nitride of certain semiconductor structures the adverse growth of colloidal silica depositing on exposed silicon dioxide regions may hinder silicon nitride removal during processing. More specifically, silicon nitride formed in structures having narrow gaps, narrow trenches, and/or high aspect ratios are particularly problematic. As used herein, high aspect ratio structures have aspect ratios of at least 4:1 or greater. Such structures may be found in a wide variety of semiconductor structures such as logic devices, interconnect structures, Fin Field Effect Transistors (FinFET), 3D semiconductor structures, flash memory devices such as Not AND (NAND) type memory devices, etc.

In a phosphoric acid silicon nitride etch, the high selectivity between the silicon nitride and silicon dioxide etch rates is modulated, at least in part, by the silicon content in the phosphoric acid solution. The higher the silicon content the lower the silicon dioxide etch rate. Since the silicon nitride is little affected by the silicon content, the selectivity between silicon nitride and silicon dioxide etch increases as the silicon content of the solution increases. However, the increase in the silicon content of the solution results in the growth of colloidal silica deposits on the exposed silicon dioxide regions during processing. The growth of colloidal silica deposits has a negative impact for the etch of complex structures, as the colloidal silica deposits can prevent the solution flow into high aspect ratio trenches, significantly slowing the nitride etch process. Furthermore, the growth of colloidal silica deposits may have adverse effects on subsequent processing steps.

Figure 1A:
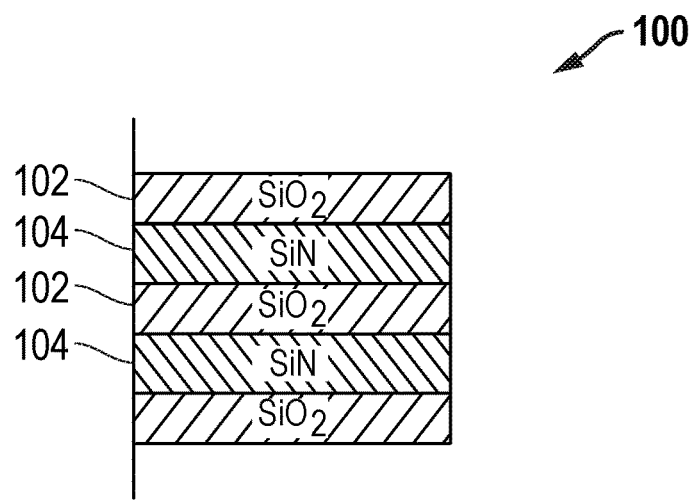
FIGS. 1A-1D illustrate an exemplary semiconductor structure having silicon nitride to be removed and the formation of silica deposits on the semiconductor structure.

As described above, the techniques disclosed herein may be applicable to a wide variety of semiconductor structures such as logic devices, interconnect structures, FinFETs, 3D semiconductor structures, NAND flash memory devices, etc. An exemplary structure is shown in FIG. 1A. Such a structure may exist in a 3D NAND device or any of many other semiconductor devices. It will be recognized that the narrow gap, high aspect ratio structure of FIG. 1A is merely exemplary and those skilled in the art will understand that the techniques described herein may be useful for the processing of many other structures in which the adverse formation of colloidal silica deposits occurs. Thus the narrow gap, high aspect ratio structure shown in FIG. 1A is merely exemplary of any of a wide variety of narrow and/or high aspect ratio structures. For example, the techniques described herein are relevant to high aspect ratio trench structures.

Figure 1B:
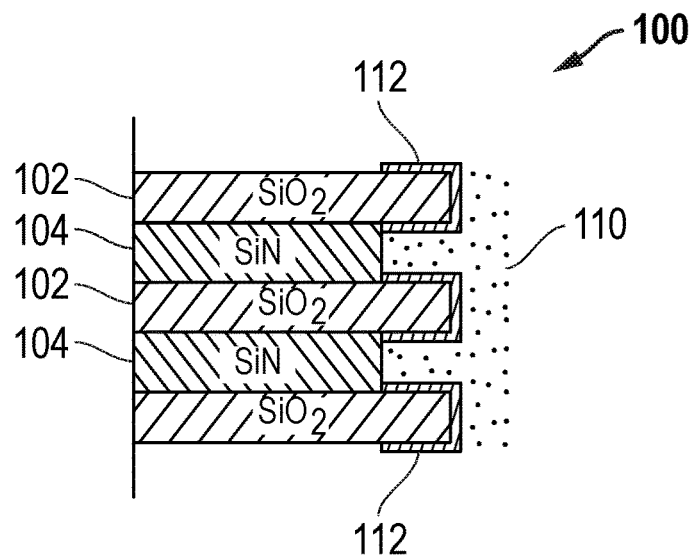
Figure 1C:
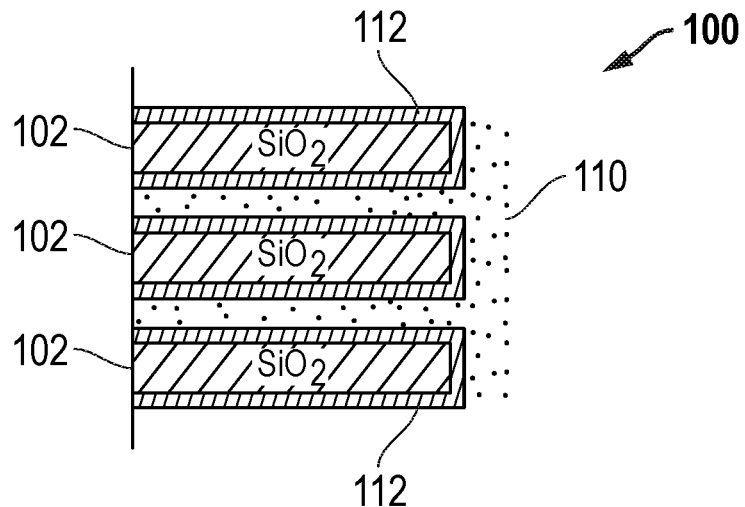
Figure 1D:
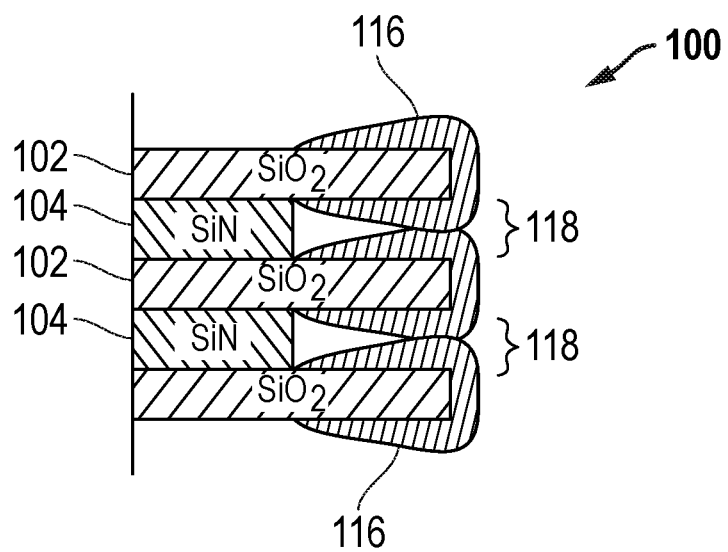

As shown in FIG. 1A, an exemplary semiconductor structure 100, which may be for example a portion of a 3D NAND structure, is shown having silicon nitride structures and silicon dioxide structures, with the silicon nitride formed in narrow, high aspect ratio, gaps. As shown narrow, high aspect ratio, gaps are formed between silicon dioxide (SiO2) layers 102. SiO2 layers 102 may alternatively be Si layers or other oxide layers. Silicon nitride (SiN) layers 104 are formed in the gaps between the SiO2 layers. Etching of the SiN layers may then occur by exposing the semiconductor structure 100 to hot phosphoric acid solution, such as for example be immersion in a hot phosphoric bath or exposing the structure to a spray of hot phosphoric acid. Due to the etching of the SiN, there is a high concentration of colloidal silica (Si(OH)4) 110 dispersed in the phosphoric acid solution near the surface of the SiO2 as shown in FIG. 1B. As shown in FIG. 1B, as the SiN etching occurs, the Si(OH)4 concentration increases and colloidal silica 110 deposits to form silica deposits 112 on the SiO2 surfaces as shown in FIG. 1B. FIG. 1C illustrates the structure 100 when the SiN layer 104 is completely removed. As can be seen in the figure, silica deposits 112 are provided on the SiO2 layers 102. It is noted that in FIG. 1C, relatively uniform silica deposits are provided. However, in practice, the deposits may build up over time at the entrances to narrow gaps or trenches. Thus, as shown in FIG. 1D, the deposits may actually "pinch off" the gaps or trenches, significantly impacting the effectiveness of the ability of the phosphoric acid to etch the remaining silicon nitride. Thus, as shown in FIG. 1D silica deposits 116 may completely close off the gap region 118 formed between SiO2 layers 102, preventing the complete etch of SiN layers 104.

Described herein are innovative methods to inhibit the growth of colloidal silica deposits on surfaces treated in phosphoric acid. In one embodiment, the disclosed techniques include the use of a colloidal silica growth inhibitor as an additive to the phosphoric acid solution. In some embodiments, the additive may have a chemistry that may contain strong anionic groups. Possible anionic groups include, but are not limited to, —COOH and —PO3H2. These chemical groups react with the Si centers in the colloidal silica network leading to the formation of silicate esters R—C(O)—SiOx resulting in the colloidal silica remaining in solution. In some embodiments, a method and apparatus is provided that monitors the silica concentration and/or the growth inhibitor concentration in the phosphoric acid during processing and adjusts the amount of those components as needed. Thus, techniques are provided for a method and apparatus to control the additive concentration to be used as well as the silica concentration in the phosphoric acid solution. The techniques described herein provide a high selectivity etch of silicon nitride towards silicon dioxide without the growth of colloidal silica deposits on the exposed surfaces. As is known in the art, water, sulfuric acid (H2SO4), and silica may also be added to the phosphoric acid solution in order to control water and/or silica content and/or process temperature so that desired etch rates and selectivities may be obtained.

As mentioned above, an additive to prevent the growth of colloidal silica deposits during the phosphoric acid treatment may be utilized. Potential additives and selection techniques for choosing additives are described in more detail below.

In one embodiment, the colloidal silica growth inhibitor may be selected from chemistries containing strong anionic groups. Possible anionic groups include, but are not limited to: —COOH and —PO3H2. Some colloidal silica growth inhibitors that contain the needed anionic groups are: citric acid, acetic acid, oxalic acid, malic acid, 2-phosphonobutane-1,2,4-tricarboxylate (PBTC), diethylenetriaminepentaacetate (DETPA), ethylenediamine-tetracarboxylate (EDTA), 1,2,3,4-butanetetracarboxylate (BTC), and amino acids such as, for example, L-histidine and L-phenylalanine. Fluorine containing chemicals such as, for example, ammonium bifluoride and ammonium fluoride, may also be used as a colloidal silica growth inhibitor. Yet another potential colloidal silica growth inhibitor is polycarboxylate. Further, it is possible to combine 2 or more of the above identified chemistries to achieve the colloidal silica growth inhibition.

Preferably, the inhibitor concentration in solution is selected to prevent increase in silicon dioxide etch rates and consequently loss of selectivity between silicon nitride and silicon dioxide. The disclosed addition of the colloidal silica growth inhibitor to the phosphoric acid solution prevents the colloidal silica deposition during processing without affecting the silicon nitride etch rate and without causing silicon dioxide loss.

In some embodiments, the colloidal silica growth inhibitor (CSGI) is added to the phosphoric acid solution prior to exposing the substrate surface to the solution. One possibility is to mix the CSGI into the phosphoric acid supply system. In the case of an immersion system, the CSGI can be mixed in the immersion tank. It is also possible to spike the CSGI during the phosphoric acid processing to keep its concentration constant inside the solution. For the case of single substrate processing, the CSGI can be mixed to the phosphoric acid supply line prior to the fluid dispense on the substrate surface or can be supplied by a separate feed and supplied separately to the substrate surface. In the case where the CSGI is supplied by a separate feed, the CSGI dispense volume and location can be controlled to achieve the best concentration distribution over the substrate surface. More details of exemplary apparatus and techniques for applying the CSGI are provided below. It will be recognized that embodiments of the techniques described herein are not limited to particular apparatus and methods for supplying the CSGI. Thus, those skilled in the art will recognize that a wide range of methods and apparatus may utilize the CSGI techniques disclosed herein.

As described, in one embodiment the addition of a colloidal silica growth inhibitor to the H3PO4 solution is provided. The various inhibitors described above may be utilized singularly or in combination. Thus, it is possible to combine 2 or more chemistries to achieve the colloidal silica growth inhibition. Further, it will be recognized that various equivalent chemical compositions may be utilized to achieve the benefit of inhibiting the growth of colloidal silica. The disclosed addition of the colloidal silica growth inhibitor to the phosphoric solution prevents the colloidal silica deposition during processing and minimizes the effects on the silicon nitride etch rate and silicon dioxide loss. Further, though described herein with regard to a process that inhibits colloidal silica deposition on a surface, the use of a colloidal silica growth inhibitor may also be utilized in combination with techniques that remove silica growth deposited on a surface by reversal of the colloidal silica deposition process, such as described in concurrently filed U.S. patent application Ser. No. 15/467,973, entitled "Process and Apparatus for Processing a Nitride Structure Without Silica Deposition," by Bassett et al., the disclosure of which is expressly incorporated herein in its entirety by reference.

As is known to those skilled in the art, a variety of techniques and apparatus may be utilized to accomplish a hot phosphoric acid etch. For example, single substrate systems may be utilized or batch multi-substrate immersion systems may be utilized. Any of such variety of techniques may advantageously utilize the techniques disclosed herein. Further, how the CSGI is added to the wet chemical etching system may vary. For example, the CSGI may be added to the phosphoric acid solution through a mechanism of supplying CSGI from a separate holding or supply tank to the substrate processing system. One possibility is to mix the CSGI to the phosphoric acid supply system in a "point of use" mixing configuration. Another possibility is to mix the CSGI into the phosphoric acid supply system in a blending tank prior to releasing to the substrate processing system (the advantage here of maintaining better control of chemical concentration and mixing temperature fluctuations).

Thus, for example, in the case of an immersion system, the CSGI can be mixed in the immersion tank via an independent supply line that supplies the CSGI. Alternatively, the CSGI can be pre-mixed to the phosphoric acid solution prior to dispense into the tank. In yet another alternative, the CSGI can be added to the phosphoric acid solution recirculation loop. It is also possible to, periodically or at a predetermined point of time, spike the CSGI during the phosphoric acid processing. The goal of adding the CSGI during the processing (as opposed to pre-mixing CSGI prior to application), is to keep its concentration constant inside the solution in the case of "bleed and feed" acid replenishment methods, or to conserve cost of consumables (if the additive is only necessary above a certain amount of dissolved silicon, which occurs after the processing has been ongoing for some time).

For the case of single substrate processing, the CSGI can be mixed to the phosphoric acid solution supply line prior to dispense on the substrate surface or can be supplied by a separate dispense apparatus, for example a second dispense nozzle. In the case where the CSGI is applied by a separate nozzle, the CSGI dispense volume and location can be controlled to achieve the best concentration distribution over the substrate surface.

Figure 2:
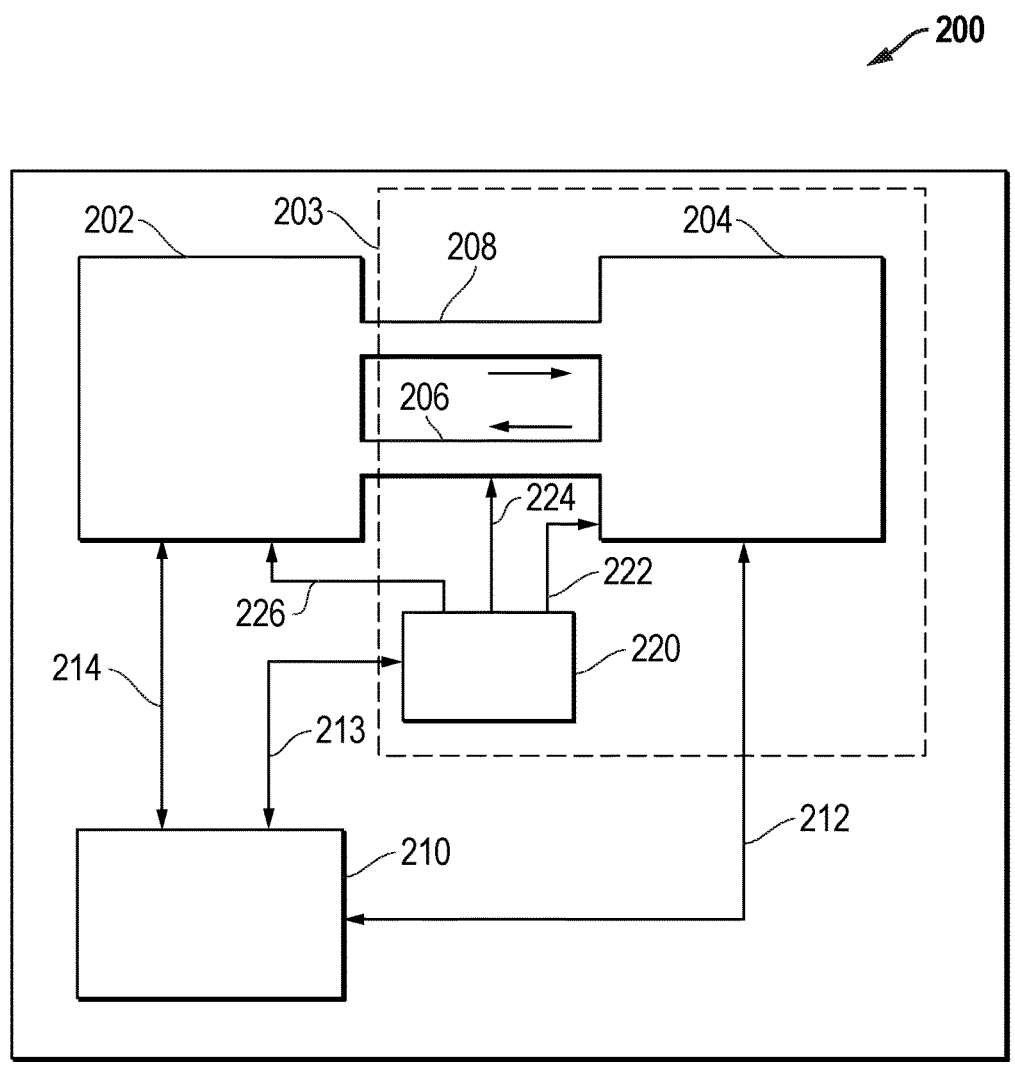
FIG. 2 illustrates an exemplary wet chemical processing system which may be used to perform the techniques described herein.

FIG. 2 illustrates one exemplary wet chemical processing system 200. It will be recognized that the techniques described herein may be utilized with a wide variety of other wet chemical processing systems. A chamber 202 is provided. The chamber 202 is configured to receive a substrate and expose the substrate to a wet etch chemical composition. The chamber 202 may be a single substrate chamber or may be a chamber for process multiple substrates such as a batch immersion wet etch tank. A chemical supply system 203 may comprise a wet chemical source 204 (for example holding the phosphoric acid solution), recirculation lines 206 and 208 which provide wet chemicals to and from the chamber and a CSGI source 220 which may provide CSGI to the chamber 202, chemical source 204 or recirculation line 206 via CSGI supply lines 222, 224 and/or 226. It will be recognized that, in most embodiments, only one CSGI supply line 222, 224 or 226 need be utilized as most systems would be designed for introduction of CSGI at only one point in the system. A controller 210 is coupled to the chamber 202, wet chemical source 204 and the CSGI source 220 to control and/or receive feedback from the various components of the wet chemical processing system 200 via signal lines 212, 213 and 214. In one exemplary embodiment, the controller 210 may be a processor, microcontroller, or programmable logic device in combination with other circuitry such as memory, I/O ports, etc. In one embodiment, the processor, microcontroller or programmable logic device may be configured to execute instructions or configuration files to perform the functions described herein.

Independent of which technique is utilized to dispense the CSGI into the wet chemical processing system, the methods and apparatus described herein allow for the system to achieve and control the desired concentration of colloidal silica growth inhibitor in the solution. In one embodiment, the controller 210 of the system monitors the colloidal silica growth inhibitor concentration, monitors the water concentration in the phosphoric acid solution, monitors the solution temperature, and monitors the silica concentration in the phosphoric acid solution. The system adds colloidal silica growth inhibitor and/or water and/or silica to achieve the target etch rate and selectivity without the growth of colloidal silica on the exposed surfaces. The system can adjust the amount of added CSGI at a time-dependent point in the processing, determined by experimental determination, or the system may dynamically adjust the amount of added colloidal silica growth inhibitor to the solution to obtain the desired concentration profile through a feedback control mechanism, or through a pre-determined (feed forward) control mechanism. It can be advantageous to start at lower or no concentration of CSGI in solution and ramp the CSGI concentration during the etch as silica from the dissolution of the silicon nitride is added to the solution locally, thereby increasing the silica concentration.

The capability of dynamically and spatially controlling the concentration of the colloidal silica growth inhibitor during the wet process also brings the possibility of tailoring the etch rate selectivity on the substrate surface that is low at the regions where silicon dioxide needs to be removed and high at the regions where silicon dioxide cannot be removed. Moreover, it also allows for a process sequence where an initial low selectivity step is used to slowly remove the silicon dioxide or silicon oxynitride layer that resides on top of the silicon nitride film, being followed by a high selectivity step to quickly remove the silicon nitride layer without resulting in the deposition of colloidal silica.

Thus, a method and apparatus to dynamically and spatially control the concentration of colloidal silica growth inhibitor is provided. Control of an exemplary single substrate system is described below, however, it will be recognized that the control techniques may also be applied to immersion batch systems.

Figure 3:
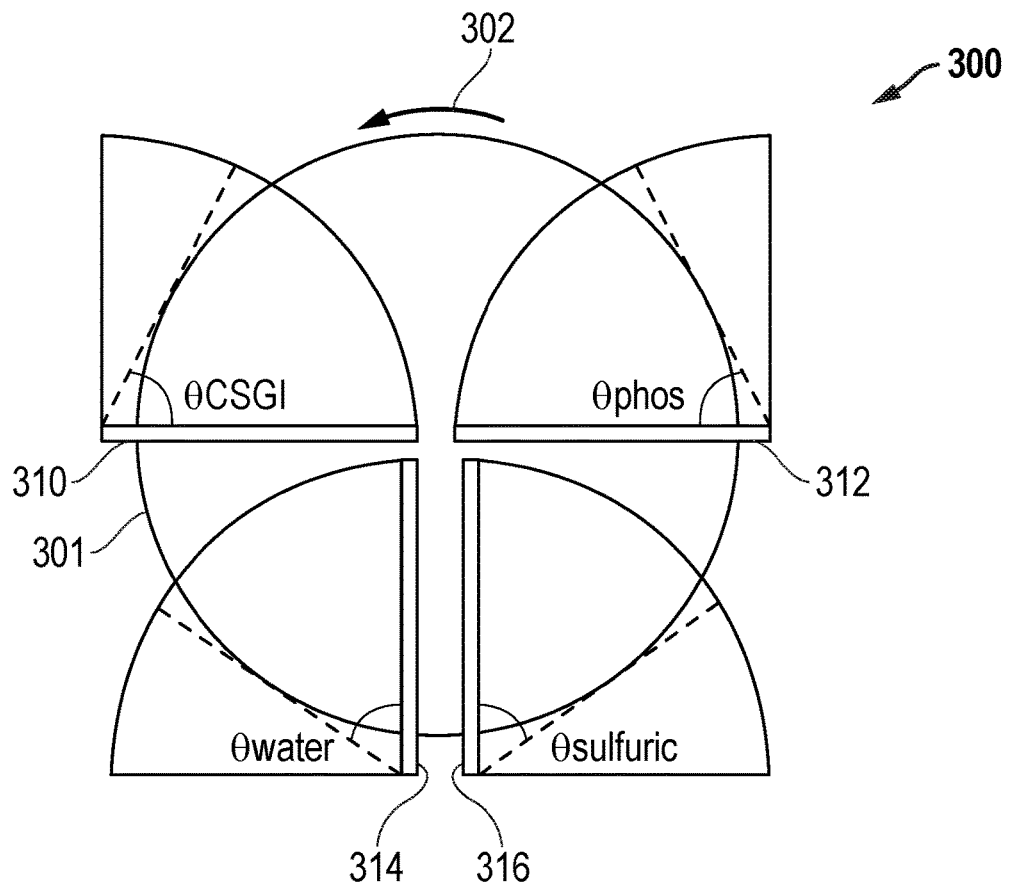
FIG. 3 illustrates an exemplary dispense system for a single substrate wet chemical processing system.

An exemplary single substrate CSGI dispense apparatus 300 is provided in FIG. 3. The single substrate CSGI dispense apparatus 300 may be provided within a single substrate chamber of wet chemical processing system 200 of FIG. 2. As shown in FIG. 3, a substrate 301 is provided with an angular rotation (ω) 302. A plurality of chemical dispense nozzles 310, 312, 314 and 316 are also provided. In one embodiment, each nozzle may dispense a different fluid. Thus, in such an embodiment, multiple chemicals may be mixed at the point of use on the single substrate. It will be recognized, however, that fewer dispense nozzles, or even one dispense nozzle may be used. In such cases, different chemicals may be pre-mixed prior to application on the substrate. As shown in the embodiment of FIG. 3, nozzle 310 may dispense a CSGI, nozzle 312 may dispense phosphoric acid, nozzle 314 may dispense water, and nozzle 316 may dispense sulfuric acid. In an alternative embodiment, one of the nozzles may be used to dispense silica. In an alternative embodiment, two nozzles may be used, with nozzle 310 dispensing CSGI and nozzle 312 dispensing a phosphoric acid solution comprised of water and phosphoric acid. In yet another embodiment, silica may be co-dispensed with the phosphoric acid. Those skilled in the art will recognize that other combinations of the number of nozzles and chemicals may be utilized while still obtaining the beneficial use of CSGI as described herein. In one embodiment, the dispense nozzles may move during chemical dispensing. In one embodiment, such nozzle movement occurs while the substrate 301 moves with angular rotation (ω) 302. As shown, nozzle 310 may move through an angle θCSGI, nozzle 312 may move through an angle θphos, nozzle 314 may move through an angle θwater, and nozzle 316 may move through an angle θsulfuric. The nozzles 310, 312, 314, and 316 may be single point dispense nozzles or may be a multi-point dispense nozzle having multiple dispensing points, such as a spray bar.

As described herein, the single substrate processing system provides an apparatus where a multi nozzle setup may be used to dispense the separate chemistries at different locations on the substrate surface. The selection of the temperatures, concentrations and dispense flow rates of the chemistries is done in conjunction with the dispense point to create a mixing fluid on the substrate surface with the desired concentration profile that achieves the desired etch selectivity while inhibiting the growth of colloidal silica on the substrate.

Figure 4:
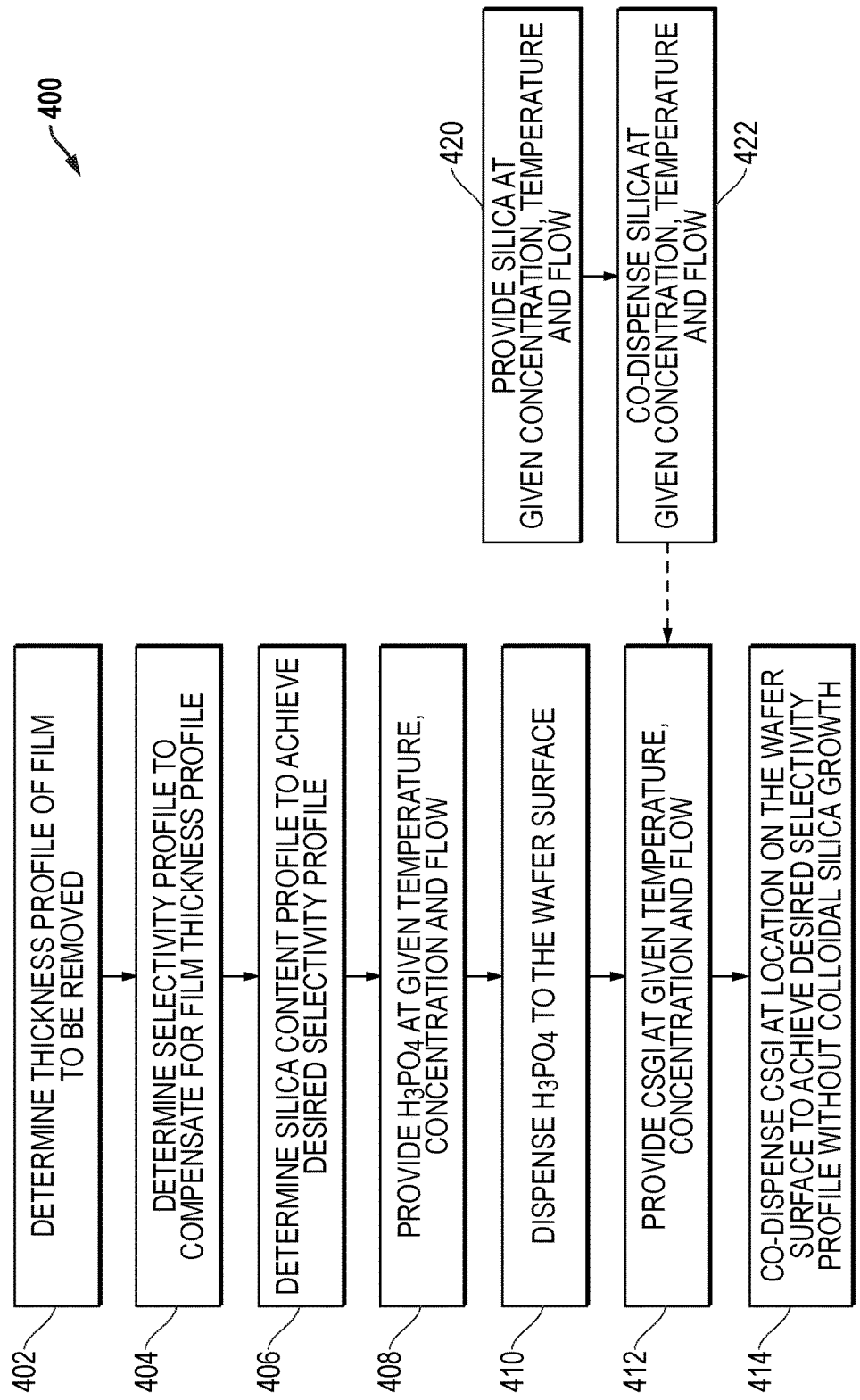
FIGS. 4 and 5 illustrate an exemplary process flow for one embodiment of a single substrate wet chemical processing system utilizing the techniques described herein.
Figure 5:
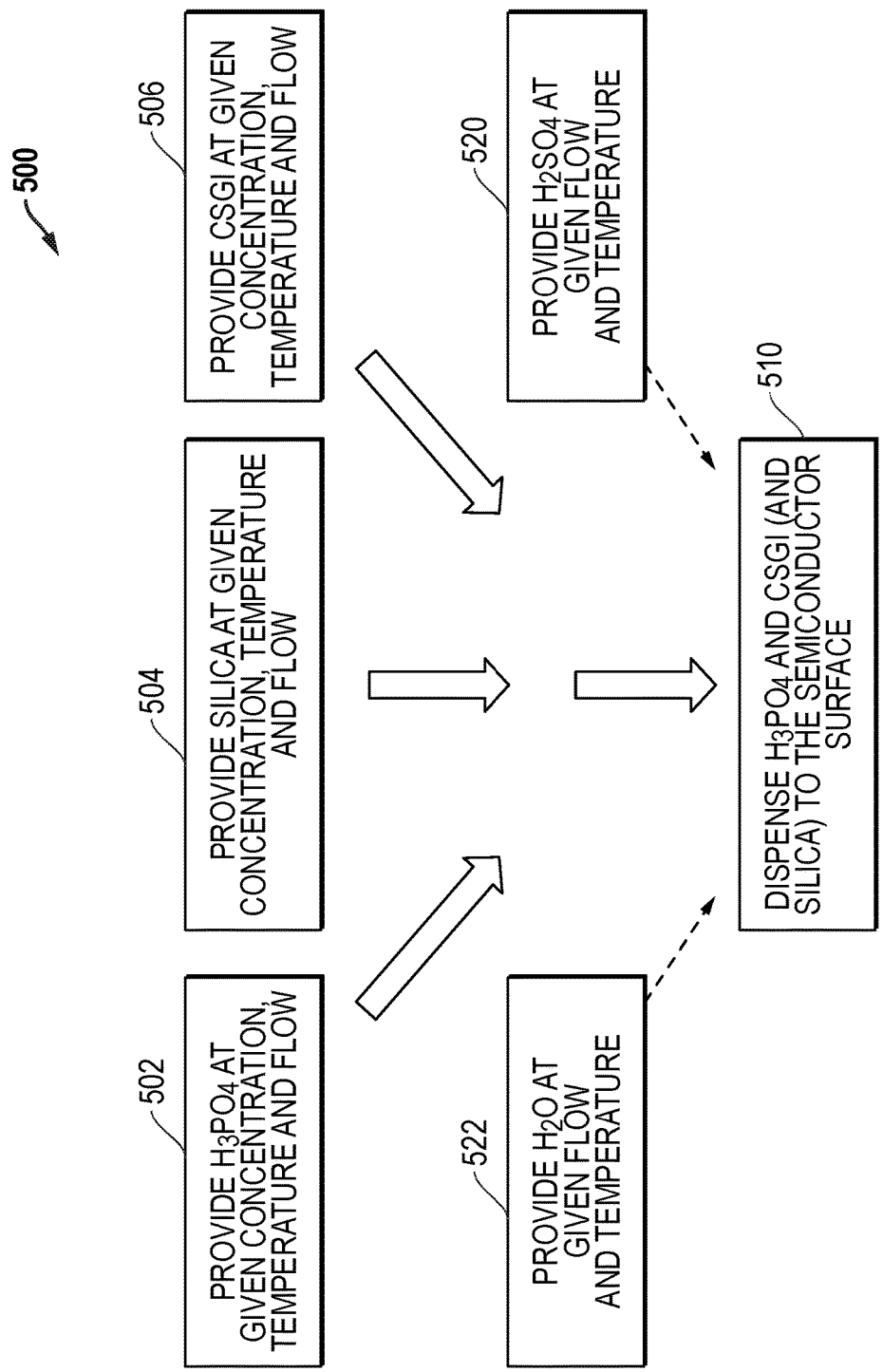

Exemplary process flows for using CSGI in a single substrate system are shown in FIGS. 4 and 5. It will be recognized that many other process flows may be used while still obtaining the benefits of the use of CSGI. Further, it will be recognized that various steps of the process flows are not required to be performed, or if performed, may not be performed for each substrate. As shown in FIG. 4, a process flow 400 begins at step 402 with a determination of the thickness profile of the film to be removed. At step 404, a determination is made for the selectivity profile required to compensate for the film thickness profile of step 402. In step 406, a determination of the silica content profile that achieves the desired selectivity profile is made. At step 408, H3PO4 is provided at a given temperature, concentration and flow. At step 410, H3PO4 is dispensed to the substrate surface. At step 412, CSGI is provided at a given temperature, concentration and flow. At step 414, CSGI is dispensed at locations on the substrate surface to achieve the desired selectivity profile without colloidal silica growth. It will be recognized that the dispense steps 410 and 414 may be performed together at the same time, may be performed serially, or may be performed in a combination of a simultaneous and serial dispense. For example, step 410 may initially start and then step 414 may start at a later point in time while step 410 is still being performed.

The process flow 400 may also include a variety of other steps. For example, as shown in FIG. 400 the process flow may optionally include step 420 in which silica is provided at a given concentration, temperature and flow. Then at step 422, silica may be dispensed to the substrate surface. As with the other dispense steps, step 422 may be performed simultaneously with the other dispense steps, performed serially or performed as a combination of a simultaneous and serial dispense. Additionally, though not shown, water and sulfuric acid may also be provided and dispensed in the process flow 400.

FIG. 5 provides an alternative process flow 500 for using CSGI in a single substrate system. As shown in the process flow 500, phosphoric acid, silica, and CSGI may be provided together, such as for example, through pre-mixing in a chemical supply line or chemical supply tank. As shown in FIG. 5, process flow 500 includes step 502 in which phosphoric acid is provided at a given concentration, temperature, and flow. In step 504, silica is provided at a given concentration, temperature, and flow. In step 506, CSGI is provided at a given concentration, temperature, and flow. Then in step 510, the phosphoric acid, CSGI and silica are dispensed to the substrate. Additional chemicals may be added to the system such as shown by step 520 in which sulfuric acid is provided at a given concentration, temperature, and flow. Also, additional water may be added to the system as needed at step 522 which provides water at a given temperature and flow.

Figure 6:
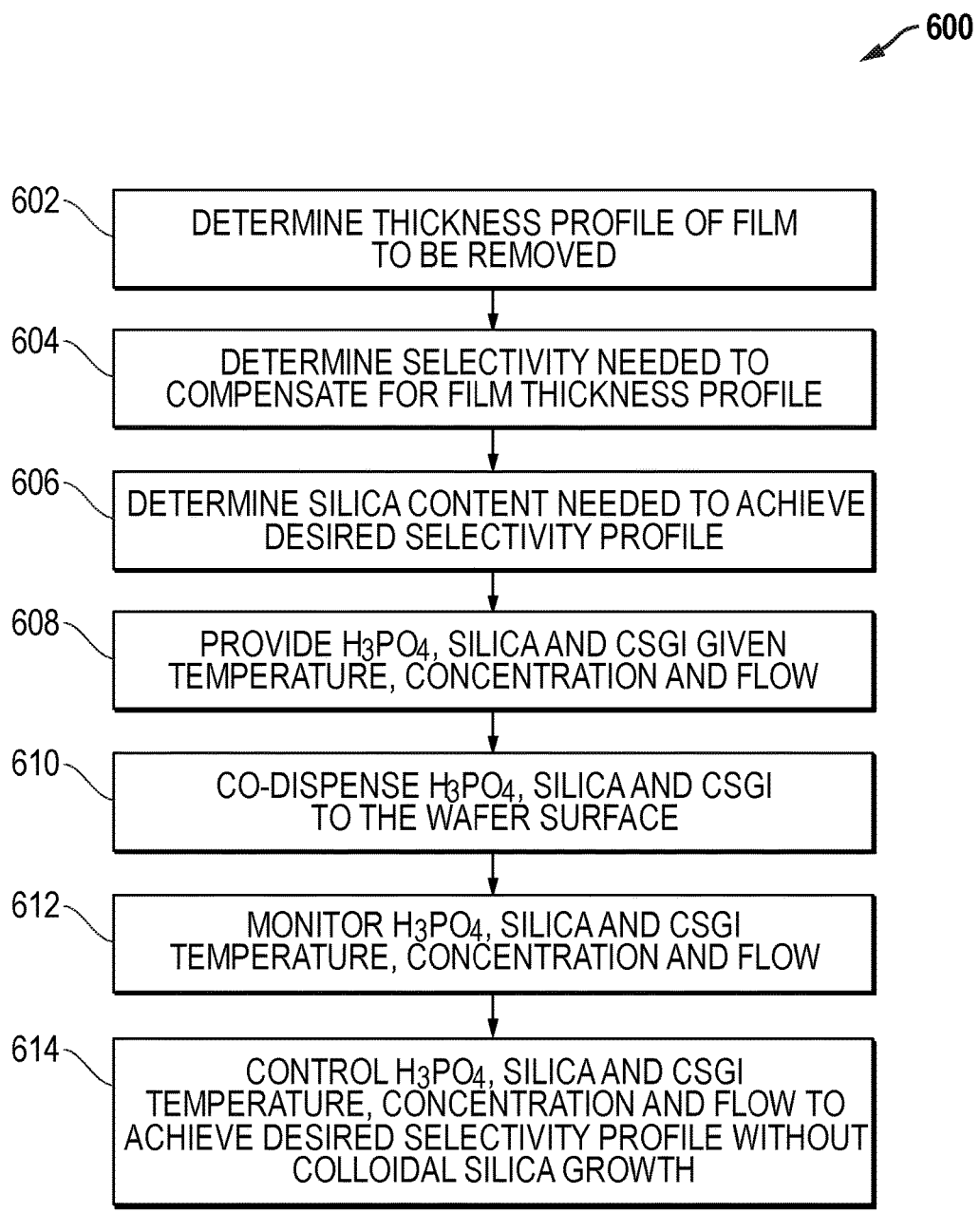
FIG. 6 illustrates an exemplary process flow for one embodiment of a batch immersion wet chemical processing system utilizing the techniques described herein.

An exemplary process flow 600 for a batch immersion system is provided in FIG. 6. Process flow 600 begins with step 602 with a determination of the thickness profile of the film to be removed. At step 604, a determination is made for the selectivity profile required to compensate for the film thickness profile of step 602. In step 606, a determination of the silica content profile that achieves the desired selectivity profile is made. At step 608, phosphoric acid, silica and CSGI are provided at a given temperature, concentration and flow. At step 610, phosphoric acid, silica and CSGI are co-dispensed on the surfaces of the batch of substrates by immersing the substrates in the solution. At step 612, the phosphoric acid, silica and CSGI concentrations, temperatures and flows are monitored. At step 614, the phosphoric acid, silica and CSGI concentrations, temperatures and flows are controlled to achieve the desired selectivity profile without colloidal silica growth on the substrate.

Though not shown in the process flows of FIGS. 4, 5 and 6, it will be recognized that when the desired etching is completed, the substrate(s) may be removed from exposure to the wet chemical etching solution. Further, additional processing such as a rinse may then occur, as is known in the art.

Thus, as described above, a variety of process flows and conditions may be utilized to advantageous provide CSGI to a phosphoric acid solution in a variety of wet etch apparatus, including single substrate and batch immersion systems. A wide range of process conditions and variables may be adjusted, monitored and controlled to achieve a desired combination of etch characteristics (etch rate, selectivity, etc.) and inhibition of colloidal silica deposits. Further, it will be recognized that the desired process conditions and variables will depend upon the particular structures and layers on the substrate that are being processed. Thus, a number of process variables and conditions for each chemical component utilized in the system may be relevant. For example, phosphoric acid at an initial temperature ($T_{phos1}$) and concentration ($C_{phos1}$) may be delivered to a surface, for example a silicon substrate surface, at a given flow rate ($F_{phos1}$). Simultaneously, or at a later time in the etch process, colloidal silica growth inhibitor may be delivered at a given temperature ($T_{csgi1}$) and concentration ($C_{csgi1}$) to the same surface at a given flow rate ($F_{csgi1}$). For a single substrate system, the dispense location of the colloidal silica growth inhibitor ($R_{csgi1}$) may be selected to create the desired concentration profile distribution over the substrate surface. The temperature, concentration, flow rate, and dispense location of the chemicals ($T_{phos1}$, $T_{csgi1}$, $C_{phos1}$, $C_{csgi1}$, $F_{phos1}$, $F_{csgi1}$, $R_{phos1}$ and $R_{csgi1}$) are selected to ensure that the mixture reaches the desired temperature ($T_{mix1}$) and concentration ($C_{mix1}$) profile at the surface under treatment. The temperature ($T_{mix1}$) and concentration ($C_{mix1}$) profile of the chemicals in contact with the surface can be easily controlled and dynamically modified by adjusting the ratio of the flow rates of the phosphoric acid ($F_{phos}$) to the colloidal silica growth inhibitor ($F_{csgi}$) and the dispense location of the colloidal silica growth inhibitor ($R_{csgi1}$). Concentrations, temperatures, flow rates, etc. of other chemicals (such as water, silica and/or sulfuric acid) may also be adjusted, monitored and controlled. The adjustment, monitoring and control of the system may be performed through the use of a controller, such as for example, the controller 210 of the system of FIG. 2.

Some illustrative process conditions are described herein, however, these will be recognized to generally be exemplary. For example, in a single substrate system, the substrate with the surface to be treated may be rotated with a rotation speed between 1 rpm and 10,000 rpm, preferentially with a speed between 30 rpm and 3000 rpm, while receiving the dispense of phosphoric acid at a given temperature ($T_{phos1}$) in a range of 160-165 degrees C. In some cases, the temperature ($T_{phos1}$) may even exceed 180 degrees C. In batch systems, temperatures in the 160-165 degrees C. range may also be used, though temperatures as low as 145-155 degrees C. may be advantageous. In one embodiment, the phosphoric acid concentration ($C_{phos1}$) utilized may be in the range of about 80-90 wt %. In one embodiment, colloidal silica growth inhibitor (CSGI) concentrations between about 0.1% and 10% volume may be utilized. More preferable CSGI concentrations may be between about 0.2% and 1% by volume. Due to potential silicon dioxide etch rates, and consequently loss of selectivity between silicon nitride and silicon dioxide, fluorine containing chemicals such as ammonium bifluoride and ammonium fluoride may be utilized at even lower concentrations, between about 0.01% to 10% by volume, and more preferably between about 0.02% and 1% by volume. In one embodiment, colloidal silica growth inhibitor may be co-dispensed during the process at a temperature ($T_{csgi1}$) in the range of about 25-180 degrees C. The process can be started with either a phosphoric acid solution single dispense, a colloidal silica growth inhibitor dispense, or a co-dispense, preferentially being started with a phosphoric acid solution dispense. Sulfuric acid can also be co-dispensed during the process to enable temperature and water concentration selection. Furthermore, deionized water can be added during the process to enable temperature and etch rate control. During processing the process parameters can be dynamically changed to locally modulate the process temperature of the substrate surface.

As describe above, growth of colloidal silica deposits on a substrate is inhibited through the use of a CSGI additive added to a phosphoric acid solution. The use of a CSGI is particularly advantageous for phosphoric acid solutions that are used to etch silicon nitride over a silicon oxide. The use of CSGI is particularly advantageous for removing silicon nitride from high aspect ratio structures.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for wet etching of structures on a microelectronic substrate, comprising:
    loading the microelectronic substrate into a wet chemical processing system, the microelectronic substrate having a first structure of silicon nitride and a second structure of silicon oxide, each having an exposed surface;
    dispensing onto the substrate a wet etching solution, wherein the wet etching solution comprises:
        water,
        phosphoric acid,
        sulfuric acid, and
        a colloidal silica growth inhibitor;
    etching the first structure on the microelectronic substrate selectively over the second structure on the microelectronic substrate without creating a growth of colloidal silica deposits on the exposed surfaces of the first structure or second structure on the substrate; and monitoring etch selectivity during the etching and adjusting the wet etching solution to maintain the selectivity, wherein adjusting the wet etching solution comprises adjusting the concentration of the colloidal silica growth inhibitor, a flow rate of the colloidal silica growth inhibitor, a temperature of the colloidal silica growth inhibitor, the concentration of the water, a flow rate of the water, a temperature of the water, the concentration of the phosphoric acid, a flow rate of the phosphoric acid, a temperature of the phosphoric acid, the concentration of sulfuric acid, a flow rate of the sulfuric acid, a temperature of the sulfuric acid, a flow rate ratio of the phosphoric acid to the colloidal silica growth inhibitor, and a concentration of silica added to the wet etching solution.

2. The method of claim 1, wherein the colloidal silica growth inhibitor contains at least one —COOH group, or at least one —PO3H2 group, or both.

3. The method of claim 1, wherein the colloidal silica growth inhibitor is a polycarboxylate.

4. The method of claim 1, wherein the colloidal silica growth inhibitor comprises at least one compound selected from citric acid, acetic acid, oxalic acid, malic acid, 2-phosphonobutane-1,2,4-tricarboxylate (PBTC), diethylenetriaminepentaacetate (DETPA), ethylenediamine-tetracarboxylate (EDTA), 1,2,3,4-butanetetracarboxylate (BTC), amino acids, L-histidine, L-phenylalanine, ammonium bifluoride, and/or ammonium fluoride.

5. The method of claim 1, wherein adjusting the concentration of the colloidal silica growth inhibitor in the wet etching solution comprises adding more of the colloidal silica growth inhibitor to adjust its concentration in the wet etching solution.

6. The method of claim 1, wherein monitoring etch selectivity during the etching and adjusting the wet etching solution to maintain the selectivity comprises monitoring the concentration of colloidal silica and the concentration of the colloidal silica growth inhibitor during the etching and increasing the concentration of the colloidal silica growth inhibitor as the concentration of colloidal silica increases.

7. A method for wet etching of structures on a microelectronic substrate, comprising:
loading the microelectronic substrate into a wet chemical processing system, the microelectronic substrate having a first structure of silicon nitride and a second structure of silicon oxide, each having an exposed surface;
selecting a target etch rate and a target etch selectivity for etching the first structure of silicon nitride relative to the second structure of silicon oxide;
dispensing onto the substrate a wet etching solution comprising water, phosphoric acid, and a colloidal silica growth inhibitor;
selectively etching the first structure over the second structure, wherein a colloidal silica concentration in the wet etching solution increases as the first structure of silicon nitride is etched, and wherein the colloidal silica growth inhibitor reacts with the colloidal silica to cause it to remain in solution without depositing on the exposed surfaces; and
while selectively etching the first structure, monitoring the concentrations of the colloidal silica growth inhibitor, water, phosphoric acid and colloidal silica in the wet etching solution and adjusting the wet etching solution by adjusting the concentration of one or more of the colloidal silica growth inhibitor, water, or silica to maintain a concentration profile for the wet etching solution that achieves the target etch rate and the target etch selectivity until the first structure is removed without depositing the colloidal silica on the exposed surfaces.

8. The method of claim 7, wherein the adjusting includes adding more of the colloidal silica growth inhibitor to increase its concentration as the colloidal silica concentration increases to cause the increased colloidal silica concentration to remain in solution.

9. The method of claim 7, wherein adjusting the wet etching solution further comprises adjusting one or more of a flow rate of the colloidal silica growth inhibitor, a temperature of the colloidal silica growth inhibitor, a flow rate of the water, a temperature of the water, a flow rate of the silica, a temperature of the silica, the concentration of the phosphoric acid, a flow rate of the phosphoric acid, a temperature of the phosphoric acid, and a flow rate ratio of the phosphoric acid to the colloidal silica growth inhibitor.

10. The method of claim 7, wherein the colloidal silica growth inhibitor contains at least one —COOH group, or at least one —PO3H2 group, or both.

11. The method of claim 7, wherein the colloidal silica growth inhibitor is a polycarboxylate.

12. The method of claim 7, wherein the colloidal silica growth inhibitor comprises at least one compound selected from citric acid, acetic acid, oxalic acid, malic acid, 2-phosphonobutane-1,2,4-tricarboxylate (PBTC), diethylenetriaminepentaacetate (DETPA), ethylenediamine-tetracarboxylate (EDTA), 1,2,3,4-butanetetracarboxylate (BTC), amino acids, L-histidine, L-phenylalanine, ammonium bifluoride, and/or ammonium fluoride.

13. A method for wet etching of structures on a microelectronic substrate, comprising:
loading the microelectronic substrate into a wet chemical processing system, the microelectronic substrate having a first structure of silicon nitride and a second structure of silicon oxide, each having an exposed surface;
using a wet etching solution, selectively etching the first structure of silicon nitride over the second structure of silicon oxide for a time duration until the first structure is removed, wherein the wet etching solution comprises water, phosphoric acid, and a concentration of a colloidal silica growth inhibitor that is increased during the time duration from an initial concentration to a final, higher concentration to inhibit growth of colloidal silica deposits on the exposed surfaces of the first and second structures; and
monitoring etch selectivity during the etching and adjusting the wet etching solution to maintain the selectivity, wherein adjusting the wet etching solution comprises adjusting a flow rate of the colloidal silica growth inhibitor, a temperature of the colloidal silica growth inhibitor, the concentration of the water, a flow rate of the water, a temperature of the water, the concentration of the phosphoric acid, a flow rate of the phosphoric acid, a temperature of the phosphoric acid, a flow rate ratio of the phosphoric acid to the colloidal silica growth inhibitor, and a concentration of silica added to the wet etching solution.

14. The method of claim 13, wherein the colloidal silica growth inhibitor contains at least one —COOH group, or at least one —PO3H2 group, or both.

15. The method of claim 13, wherein the colloidal silica growth inhibitor is a polycarboxylate.

16. The method of claim 13, wherein the initial concentration is zero, and the final, higher concentration is in the range of 0.1-10%.

17. The method of claim 16, wherein the final, higher concentration is in the range of 0.2-1%.

18. The method of claim 13, wherein the colloidal silica growth inhibitor comprises at least one compound selected from citric acid, acetic acid, oxalic acid, malic acid, 2-phosphonobutane-1,2,4-tricarboxylate (PBTC), diethylenetriaminepentaacetate (DETPA), ethylenediamine-tetracarboxylate (EDTA), 1,2,3,4-butanetetracarboxylate (BTC), amino acids, L-histidine, L-phenylalanine, ammonium bifluoride, and/or ammonium fluoride.

19. The method of claim 13, wherein monitoring etch selectivity during the etching and adjusting the wet etching solution to maintain the selectivity comprises monitoring the concentration of colloidal silica and the concentration of the colloidal silica growth inhibitor during the etching and increasing the concentration of the colloidal silica growth inhibitor as the concentration of colloidal silica increases.

* * * * *